United States Patent
Prajuckamol et al.

(10) Patent No.: US 10,319,659 B2
(45) Date of Patent: Jun. 11, 2019

(54) SEMICONDUCTOR PACKAGE AND RELATED METHODS

(71) Applicant: SEMICONDUCTOR COMPONENTS INDUSTRIES, LLC, Phoenix, AZ (US)

(72) Inventors: Atapol Prajuckamol, Klaeng (TH); C H Chew, Seremban (MY); Yushuang Yao, Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/783,533

(22) Filed: Oct. 13, 2017

(65) Prior Publication Data
US 2019/0115275 A1    Apr. 18, 2019

(51) Int. Cl.
*H01L 23/14*    (2006.01)
*H01L 23/32*    (2006.01)
*H01L 23/13*    (2006.01)
*H01L 23/58*    (2006.01)
*H01L 23/04*    (2006.01)
*H01L 23/498*   (2006.01)
(Continued)

(52) U.S. Cl.
CPC .......... *H01L 23/32* (2013.01); *H01L 21/4842* (2013.01); *H01L 21/4853* (2013.01); *H01L 21/4885* (2013.01); *H01L 21/56* (2013.01); *H01L 21/565* (2013.01); *H01L 23/04* (2013.01); *H01L 23/13* (2013.01); *H01L 23/142* (2013.01); *H01L 23/3157* (2013.01); *H01L 23/4006* (2013.01); *H01L 23/49811* (2013.01); *H01L 23/49866* (2013.01); *H01L 23/585* (2013.01); *H01L 23/3735* (2013.01); *H01L 2021/60285* (2013.01); *H01L 2023/4087* (2013.01);
(Continued)

(58) Field of Classification Search
CPC ............ H01L 21/4803; H01L 21/4853; H01L 21/4875; H01L 21/4885; H01L 21/56; H01L 21/565; H01L 2021/60285; H01L 23/13; H01L 23/142; H01L 23/3157; H01L 23/32; H01L 23/3735; H01L 23/4012; H01L 2023/4087; H01L 23/49811; H01L 24/66; H01L 24/69; H01L 24/89; H01L 2224/66; H01L 2224/69; H01L 2224/89; H01L 2924/15151; H01L 2924/15322; H01L 2924/182
See application file for complete search history.

(56) References Cited

U.S. PATENT DOCUMENTS 5,107,329 A * 4/1992 Okinaga ............... H01L 23/057
257/698
6,892,796 B1  5/2005 Nagashima
(Continued)

*Primary Examiner* — Stephen W Smoot
(74) *Attorney, Agent, or Firm* — IPTechLaw

(57) ABSTRACT

Implementations of semiconductor packages may include: a substrate comprising a first side and a second side and a hole in the substrate. The hole extending from the first side to the second side of the substrate and positioned in a center of the substrate. The semiconductor packages may also include a bushing around the hole to the first side of the substrate. The semiconductor packages may also include a plurality of pin holders arranged and coupled on the substrate. The semiconductor package may also include a molding compound at least partially encapsulating the substrate, encapsulating a side surface of the bushing, and encapsulating a plurality of side surfaces of the plurality of pin holders.

20 Claims, 5 Drawing Sheets

(51) Int. Cl.
   *H01L 21/48*   (2006.01)
   *H01L 21/56*   (2006.01)
   *H01L 23/40*   (2006.01)
   *H01L 23/31*   (2006.01)
   *H01L 23/373*  (2006.01)
   *H01L 21/60*   (2006.01)

(52) U.S. Cl.
   CPC ............. *H01L 2924/15151* (2013.01); *H01L 2924/15322* (2013.01)

(56) References Cited

U.S. PATENT DOCUMENTS

| | | | |
|---|---|---|---|
| 7,872,868 B2 | 1/2011 | Yamanaka | |
| 8,120,171 B2 | 2/2012 | Koike et al. | |
| 8,258,622 B2* | 9/2012 | Lee | H01L 21/565 257/706 |
| 9,521,737 B2* | 12/2016 | Izuo | H01L 23/13 |
| 2010/0013085 A1* | 1/2010 | Oi | H01L 23/3121 257/693 |
| 2010/0133684 A1* | 6/2010 | Oka | H01L 21/565 257/712 |
| 2014/0367736 A1* | 12/2014 | Iizuka | H01L 25/072 257/133 |
| 2015/0294931 A1* | 10/2015 | Brucchi | H01L 21/4875 361/761 |
| 2016/0035658 A1* | 2/2016 | Kessler | H01L 23/3735 361/688 |
| 2017/0236782 A1* | 8/2017 | Nonaka | H01L 21/565 257/667 |

* cited by examiner

SEMICONDUCTOR PACKAGE AND RELATED METHODS

BACKGROUND

1. Technical Field

Aspects of this document relate generally to semiconductor packages, such as power modules for electronic control systems. More specific implementations involve power modules having screw holes.

2. Background

Conventionally, power integrated modules are packaged with rigid plastic covers. The plastic may be thermoplastic and is sandwiched around the substrate. Screw holes designed for coupling the packages to heat sinks are formed in the plastic cover when the cover is manufactured. The screw holes may be on the sides of the packages or in the middle of the package.

SUMMARY

Implementations of semiconductor packages may include: a substrate having a first side and a second side and a hole in the substrate. The hole extending from the first side to the second side of the substrate and positioned in a center of the substrate. The semiconductor packages may also include a bushing around the hole to the first side of the substrate. The semiconductor packages may also include a plurality of pin holders arranged and coupled on the substrate. The semiconductor package may also include a molding compound at least partially encapsulating the substrate, encapsulating a side surface of the bushing, and encapsulating a plurality of side surfaces of the plurality of pin holders.

Implementations of semiconductors packages may include one, all, or any of the following:

The plurality of pin holders may have a height that is the same as a height of the bushing.

The bushing may include one of copper, steel, or any combination thereof.

The bushing and the plurality of pins holders may each be coupled to the substrate through solder.

The pin holders may comprise copper.

Semiconductor packages may further include one or more die coupled to the first side of the substrate.

Implementations of semiconductor packages may include: a substrate having a first surface and a second surface, the second surface may oppose the first surface. The packages may also include two or more cutouts positioned in a first edge and in a second edge of the substrate. The packages may also include a bushing positioned around a perimeter of each of the two or more cutouts. The bushings may be coupled on the first surface of the substrate. The packages may also include a plurality of pin holders coupled on the first surface of the substrate and a plurality of pins slidably coupled into the plurality of pin holders. The packages may also include a molding compound at least partially encapsulating the substrate, a side surface of the bushing, and a plurality of side surfaces of the plurality of pin holders.

Implementations of semiconductors packages may include one, all, or any of the following:

The plurality of pin holders may have a height that is the same as a height of the bushing.

The bushing may include one of copper, steel, and any combination thereof.

The bushing positioned around a perimeter of each of the two or more cutouts may be sawed to be flush with the first edge and the second edge of the substrate.

The bushing and the plurality of pin holders may each be coupled to the substrate through solder.

The pin holders may include copper.

The semiconductor packages may further include one or more die coupled to the first surface of the substrate.

Implementations of a method of forming semiconductor packages may include: providing a substrate, the substrate may include one or more holes extending from a first side to a second side of the substrate. The method may also include coupling one or more bushings around the one or more holes on the first side of the substrate and coupling a plurality of pin holders at predetermined locations on the first side of the substrate. The method may also include encapsulating the substrate, a side surface of the one or more bushings and a plurality of side surfaces of the plurality of pin holders. The method may also include inserting a plurality of pins into the plurality of pin holders.

Implementations of a method of forming semiconductors packages may include one, all, or any of the following:

The one or more bushings and the plurality of pin holders are each coupled on the substrate through solder.

The bushing may include one of copper, steel, and any combination thereof.

The method may further include sawing the one or more bushings at a first edge and a second edge of the substrate, the one or more bushings may be flush with the first edge and the second edge of the substrate after sawing.

The encapsulating may include a film-assisted molding (FAM) method.

The encapsulating may include a mold array process (MAP).

The plurality of pins may be inserted into the plurality of pin holders through one of a jig, a machine, and any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages and implementing components and methods, consistent with the intended operation and methods.

Figure 1:
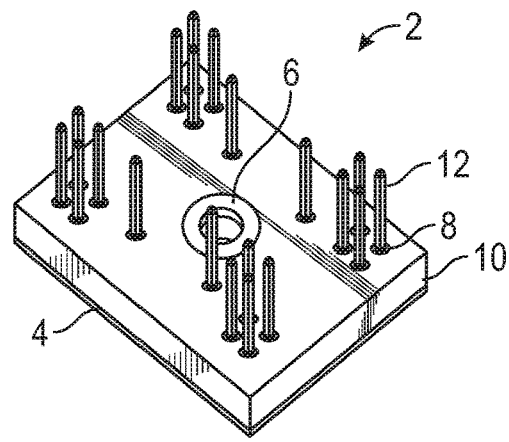
FIG. 1 is a perspective view of an implementation of a semiconductor package.
Figure 2:
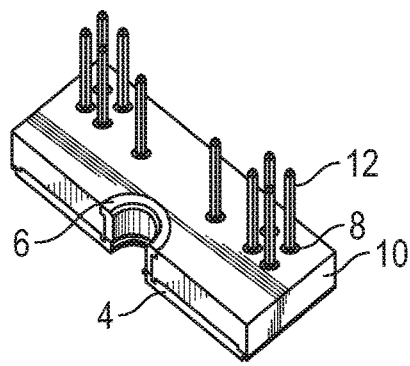
FIG. 2 is a cross sectional view of an implementation of the semiconductor package of FIG. 1.

Referring to FIG. 1, an implementation of a semiconductor package 2 is illustrated. The package includes a direct bonded copper (DBC) substrate 4 having a hole therethrough. In various implementations, the DBC may come with a precut hole. In other implementations, the hole may be laser cut during the manufacturing process. The hole may be used for a screw to mount the semiconductor package to a printed circuit board, heatsink, or other device designed to couple to a semiconductor device through a screw. The top copper layer of the substrate may be preformed prior to firing or it may be chemically etched using printed circuit board technology. In other implementations, other suitable substrates known in the art may be used including laminated substrates and ceramic/organic laminated substrates. A metal bushing 6 is coupled to/around the hole in the DBC substrate. The metal bushing 6 may include copper, steel, any combination thereof or any suitable metal known in the art. A plurality of pin holders 8 are also coupled to the DBC substrate. As illustrated, the bushings used in various package implementations disclosed herein may include a flange around an end of the bushing opposite the end that couples with the substrate. The flange extends outwardly away from the opening in the bushing. The size of this flange may vary in various implementations. In some implementations, the flange may be omitted. The use of the flange may increase the upper surface of the bushing which increases the contact area of the bushing to a screw or other fastener while minimizing the lower surface area of the bushing contacting the substrate. As illustrated, a plurality of pins 12 are inserted in the plurality of pin holders 8. In various implementations, the pin holders 8 may include copper, though in other implementations they may be made of any metal disclosed herein. The pin holders 8 and the bushing 6 may have the same height above the substrate in various implementations. The bushing 6 and pin holders 8 may be coupled to the substrate 4 through solder paste and secured through reflow during manufacturing of the semiconductor package. As illustrated, a molding compound 10 encapsulates the substrate. The molding compound covers 10 a side surface of the bushing and the side surfaces of the pin holders as can be seen in FIG. 2. As illustrated, the top surface of the bushing and pin holders is not covered by molding compound. In various implementations, the top surface may sit substantially flush with the top surface of the molding compound.

By non-limiting example, semiconductor packages as described herein may be used in power modules. Power modules have a wide variety of uses and may be used in, by non-limiting example, appliances, battery charging, converters, electroplating, heater controls, medical electronics, power supplies, reverse polarity protection, switches, three-phase inverters, or other devices known in the art. A power module includes one or more semiconductor devices that are designed to handle and process electrical power, such as, by non-limiting example, rectifiers, diodes, and the like.

Figure 3:
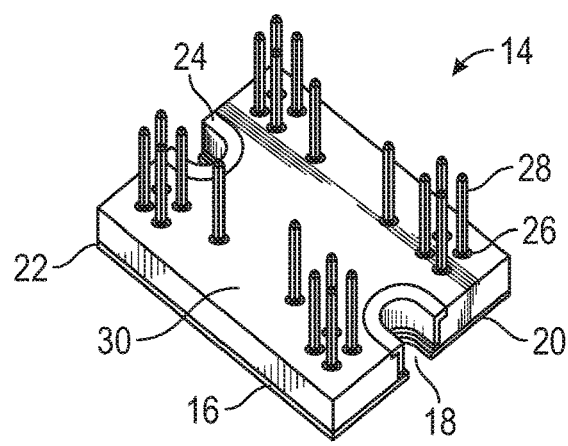
FIG. 3 is a perspective view of another implementation of a semiconductor package.
Figure 4:
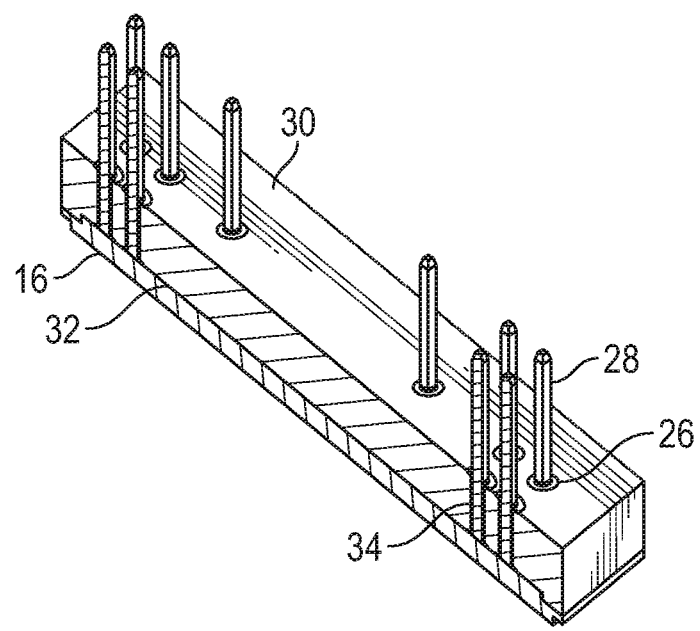
FIG. 4 is a cross sectional view of the implementation of a semiconductor device of FIG. 3.

Referring to FIG. 3, another implementation of a semiconductor package 14 is illustrated. The semiconductor package 14 includes a substrate 16 having two or more cutouts or reentrant openings 18 positioned at a first edge 20 and a second edge 22 of the substrate. A bushing 24 is positioned around a perimeter of each of the two or more cutouts 18. The bushing made be made of any material disclosed herein. A portion of the bottom surface of the bushing 24 is coupled to a first side of the substrate through solder. A molding material is then applied to the package which covers a side surface of the bushing. In this implementation, after molding, the bushings 24 are cut or sawed to be flush with the first edge 20 and the second edge 22 of the substrate (as illustrated in FIG. 7D). A plurality of pin holders 26 are coupled to the first side of the substrate in predetermined locations and a plurality of pins 28 are slidably coupled into the plurality of pin holders 26. As previously described, the bushings 24 and the pin holders 26 may the same height above the substrate. In various implementations, the plurality of pin holders 26 may include, in various implementations, copper or any other suitable material known in the art. A molding compound 30 is shown at least partially encapsulating the substrate 16, a side surface of the bushing 24, and a plurality of side surfaces of the plurality of pin holders 26. In FIG. 4, the molding compound 30 encapsulating a first surface 32 of the substrate 16 and a plurality of side surfaces 34 of the plurality of pin holders 26 is illustrated. As previously described, the top surfaces of the bushing 24 and the pin holders 26 are not covered by molding compound. In particular implementations, the top surfaces may be substantially flush with the top surface of the molding compound.

Figure 5:
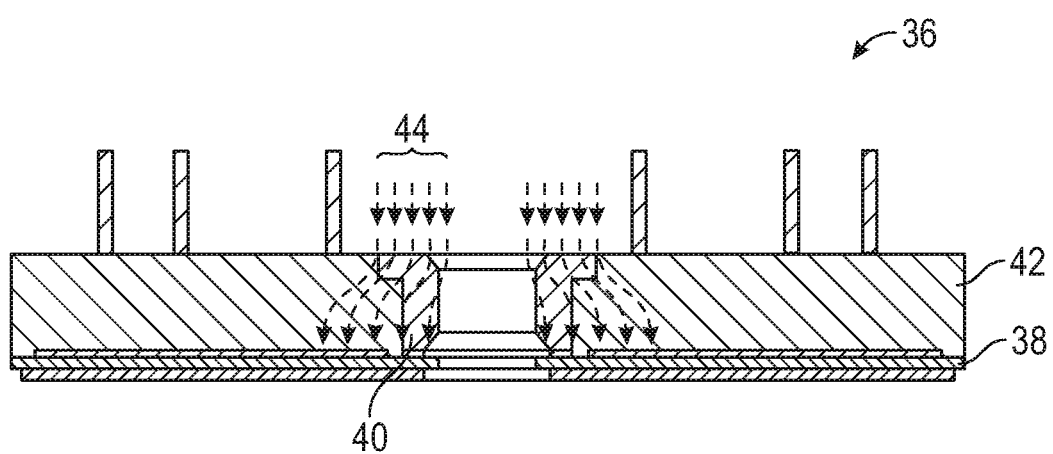
FIG. 5 is a cross sectional view of an implementation of a semiconductor device showing force distribution through the bushing and through the molding compound.

Referring to FIG. 5, a cross sectional view of an implementation of a semiconductor package 36 is illustrated. Various layers of the substrate 38 are shown. The bushing 40 is coupled to the cutout through the substrate 38. The molding compound 42 is partially encapsulating the substrate, meaning that the molding compound 42 is encapsulating the first (top) surface of the substrate 38 and not the second (bottom) surface. The arrows 44 illustrate the force distribution through the bushing 40 and the molding compound 42. This may help to take harmful force away from the rest of the package reducing stress on the substrate, the pins, and any die that may be included in the package. Furthermore, because the use of the bushings disclosed in this document permit the use of mold array process (MAP) molding to be used to form the package, the design of the bushing also may permit distribution of the forces placed on the substrate during the MAP molding process to prevent damage to the substrate and/or components coupled thereon.

Figure 6A:
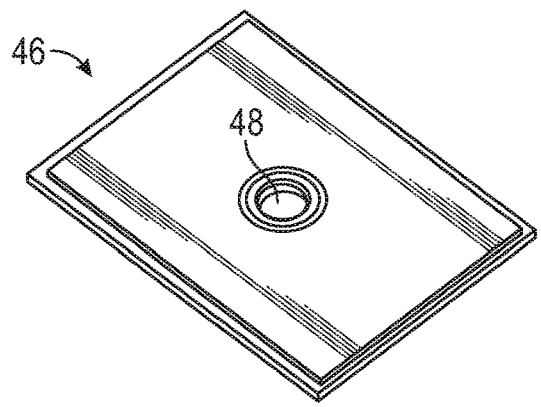
FIG. 6A-6D is an implementation of a method of forming semiconductor packages as described herein.

Referring to FIGS. 6A-6D, an implementation of a method for manufacturing a semiconductor package is illustrated. For ease of illustration, the manufacturing of only one semiconductor package is shown and described. However, the substrates and packages may be formed in an array and singulated toward the end of processing. Referring to FIG. 6A, a direct bonded copper substrate 46 is shown. DBC substrates 46 are commonly used in power modules and are known for having good thermal conductivity. In various implementations, a DBC substrate includes a ceramic tile with a sheet of copper bonded to one or both side of the copper through a high-temperature oxidation/sintering process. The top copper layer may be preformed prior to firing or chemically etched to form a plurality of traces thereon (not shown). The ceramic tile may include alumina, aluminum nitride, beryllium oxide, or any other suitable material known in the art. The substrate includes a hole 48 positioned in the center of the substrate and extending from the first side to the second side of the substrate (through the substrate). The hole may be cut with a laser. In various implementations, the substrate may be precut or cut at the time of manufacturing the semiconductor package.

Figure 6B:
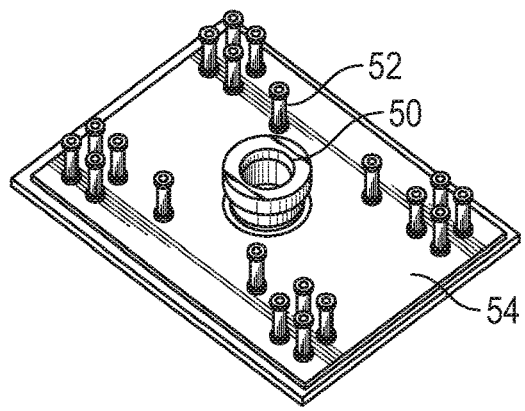

Referring to FIG. 6B, a bushing 50 and a plurality of pin holders 52 are shown coupled to the substrate 54. A solder print may be printed onto to the substrate using a solder printing system (screen printing, for example) before the bushing 50, the plurality of pin holders 52, and any die are coupled to the substrate 54 (through a placing operation). The substrate is then placed in a reflow oven or other heating apparatus to reflow the solder, bushing, and the material of the substrate to secure the bushing, pin holders, and die to the substrate. Excess solder and debris may be cleaned from the substrate using a flux cleaning process. Either before or after the placement of the bushing and pin holders (or at the same time), one or more semiconductor die and/or other passive electrical components may be coupled to the substrate through wire bonding or other electrical coupling. While the example in FIG. 6B shows the placement of both a bushing and a plurality of pin holders, in various implementations, only a bushing may be placed on the substrate (in situations where no pins are needed through the mold compound).

Figure 6C:
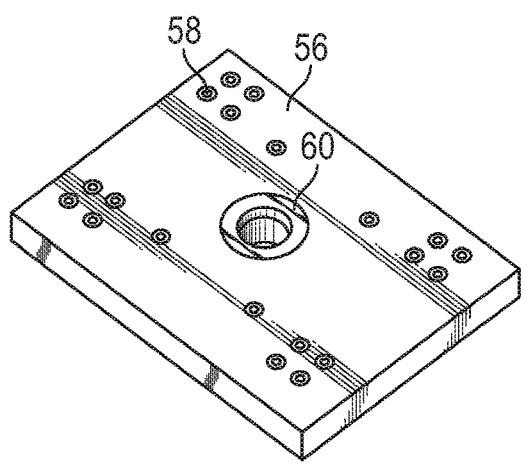

Referring to FIG. 6C, a molding compound 56 encapsulating the substrate is illustrated. As previously described, the molding compound may at least partially encapsulate a side surface of the bushing, and a plurality of side surfaces of the plurality of pin holders. The encapsulating process may be a film assisted molding (FAM) method in some implementations. The FAM method includes applying one or more plastic films in the mold. The plastic films are sucked down into the inner surfaces of the mold using vacuum force. In particular implementations, the films may be applied on the pin holders and bushing to prevent molding compound from entering the internal cavities therein. A transfer molding process is then used to encapsulate the device in the molding compound. In other implementations, a mold array process (MAP) may be used to encapsulate the substrate, bushing, and pin holders. Any remaining molding material covering the openings of the bushing and/or pin holders may be removed by grinding when using MAP molding. After the molding process is completed, the semiconductor packages may be singulated where the packages are processed together in a sheet or other grouping of attached substrates. In various implementations, the encapsulating process may be fully automated through the use of vendor supplied molding machines.

Figure 6D:
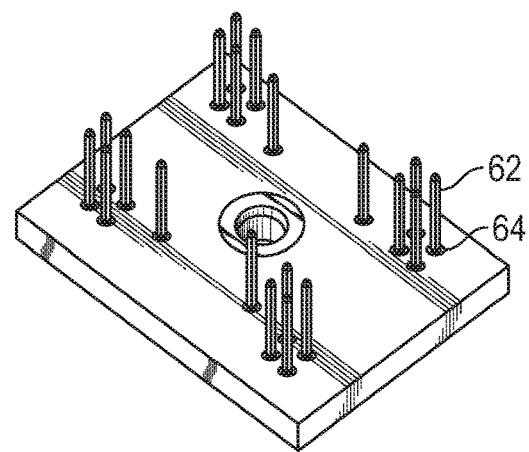

Referring to FIG. 6D, following molding, a plurality of pins 62 is inserted into the plurality of pin holders 64. In various implementations, a pin insertion tool may be used to do this. Various jigs and/or other fixtures may be employed as well to enable the insertion of the pins to avoid any damage to or bending of the pins.

Figure 7A:
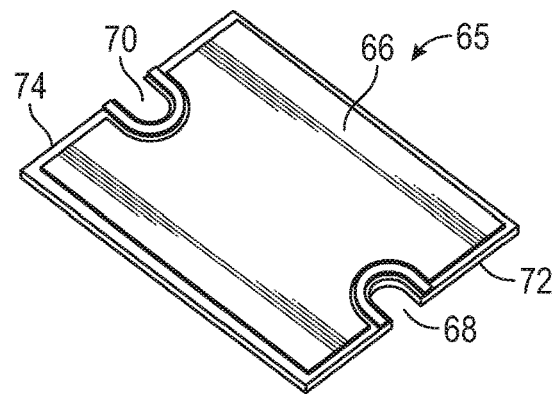
FIG. 7A-7D is an implementation of a method of forming semiconductor packages as described herein.
Figure 7B:
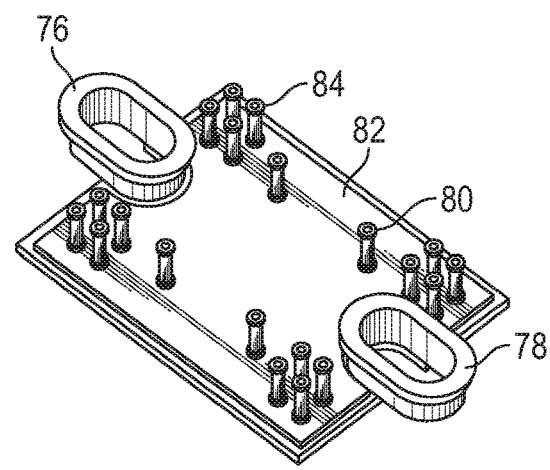
Figure 7C:
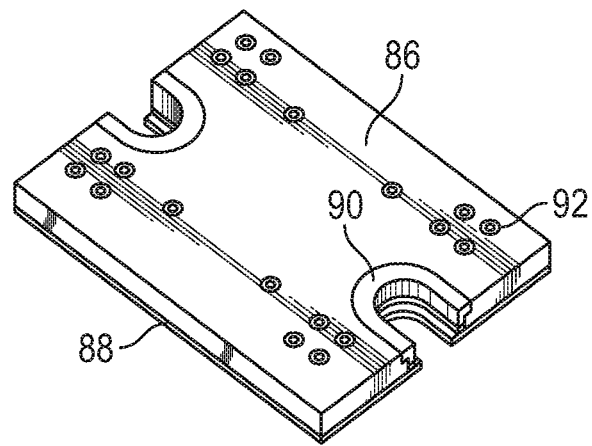
Figure 7D:
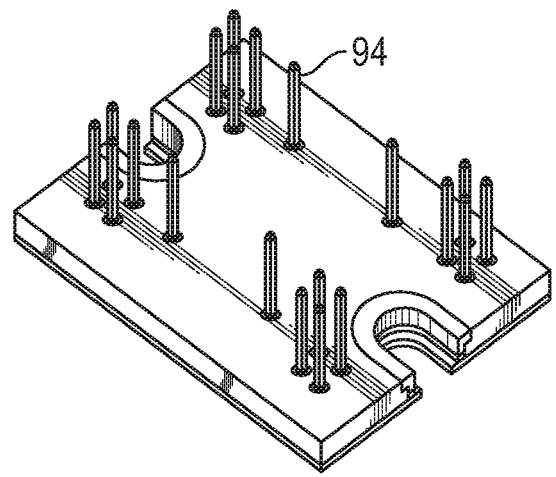

Referring to FIGS. 7A-7D, an implementation of another method of manufacturing another implementation of a semiconductor package is illustrated. As previously described, the manufacturing of only one semiconductor package is shown and described. Referring to FIG. 7A, a direct bonded copper (DBC) substrate 65 having a first side 66 and a second side (bottom side, not shown) is illustrated. In this particular implementation, the substrate 65 includes two cut outs 68 and 70 on a first edge 72 and a second edge 74 of the substrate. The hole may be cut using a laser. In various implementations, the substrate may be precut or cut at the time of manufacturing the semiconductor package.

Referring to FIG. 7B, bushings 76 and 78 and a plurality of pin holders 80 are shown after placing them on the substrate 82. The placing operation may be any disclosed in this document. As illustrated, a portion of a bushing is positioned around a perimeter of each of the two or more cutouts. The portions of the bushings that extend around the cut outs are coupled on the first surface of the substrate over a solder print, which may be printed using any technique disclosed in this document. The plurality of pin holders 84 are also placed in predetermined locations on the substrate. Either before or after the placement of the bushings (or at the same time), one or more semiconductor die and/or passive components may be placed in predetermined locations on the substrate and wire bonded or otherwise electrically coupled with the substrate. As previously described, reflow is performed to secure the bushing, pin holders, and die to the substrate. Excess solder and debris may be cleaned off the substrate using a flux cleaning process.

Referring to FIG. 7C, a molding compound 86 encapsulating the substrate 88 is illustrated. As previously described, the molding compound 86 may at least partially encapsulate a side surface of the bushing 90, and a plurality of side surfaces of the plurality of pin holders 92. The encapsulating process may be either film assisted molding (FAM) method as previously described or the mold array process (MAP) as previously disclosed. Any remaining molding on the top surfaces/openings of the bushings and/or pin holders may be removed by grinding when using MAP molding. Where the substrates are being processed while being coupled together (such as in a sheet or panel), the semiconductor packages are then singulated after the encapsulation process. As illustrated, during singulation, the bushings are cut or sawed to be flush with the edge of the semiconductor package. After sawing the bushings may need to be de-burred to remove any excess metal and metal shavings.

Following singulation, referring to FIG. 7D, a plurality of pins 94 are inserted into the plurality of pin holders 92. Any of the pin insertion tools, fixtures, and/or jigs disclosed herein may be used for this process.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a substrate comprising a first side and a second side;
   a hole in the substrate extending from the first side to the second side and positioned in a center of the substrate;
   a bushing around the hole on the first side of the substrate;
   a plurality of pin holders arranged and coupled on the substrate;
   a molding compound at least partially encapsulating the substrate, encapsulating a side surface of the bushing, and encapsulating a plurality of side surfaces of the plurality of pin holders.

2. The semiconductor package of claim 1, wherein the plurality of pin holders have a height that is the same as a height of the bushing.

3. The semiconductor package of claim 1, wherein the bushing comprises one of copper, steel and any combination thereof.

4. The semiconductor package of claim 1, wherein the bushing and the plurality of pin holders are each coupled to the substrate through solder.

5. The semiconductor package of claim 1, wherein the pin holders comprise copper.

6. The semiconductor package of claim 1, furthering comprising one or more die coupled to the first side of the substrate.

7. A semiconductor package comprising:
- a substrate comprising a first surface and a second surface, the second surface opposing the first surface;
- two or more cutouts positioned in a first edge and in a second edge of the substrate;
- a bushing positioned around a perimeter of each of the two or more cutouts, the bushing coupled on the first surface of the substrate;
- a plurality of pin holders coupled on the first surface of the substrate;
- a plurality of pins slidably coupled into the plurality of pin holders; and
- a molding compound at least partially encapsulating the substrate, a side surface of the bushing, and a plurality of side surfaces of the plurality of pin holders.

8. The semiconductor package of claim 7, wherein the plurality of pin holders have a height that is the same as a height of the bushing.

9. The semiconductor package of claim 7, wherein the bushing comprises one of copper, steel and any combination thereof.

10. The semiconductor package of claim 7, wherein the bushing positioned around a perimeter of each of the two or more cutouts is sawed to be flush with the first edge and the second edge of the substrate.

11. The semiconductor package of claim 7, wherein the bushing and the plurality of pin holders are each coupled to the substrate through solder.

12. The semiconductor package of claim 7, wherein the pin holders comprise copper.

13. The semiconductor package of claim 7, furthering comprising one or more die coupled to the first side of the substrate.

14. A semiconductor package comprising:
- a substrate comprising a first side and a second side;
- a hole in the substrate extending from the first side to the second side and positioned in a center of the substrate;
- a bushing around the hole on the first side of the substrate;
- a flange around a first end of the bushing, the first end opposite a second end of the bushing, the second end configured to couple with the substrate;
- a plurality of pin holders arranged and coupled on the substrate;
- a molding compound at least partially encapsulating the substrate, encapsulating a side surface of the bushing, and encapsulating a plurality of side surfaces of the plurality of pin holders.

15. The semiconductor package of claim 14, wherein the plurality of pin holders have a height that is the same as a height of the bushing.

16. The semiconductor package of claim 14, wherein the bushing comprises one of copper, steel and any combination thereof.

17. The semiconductor package of claim 14, wherein the bushing and the plurality of pin holders are each coupled to the substrate through solder.

18. The semiconductor package of claim 14, wherein the pin holders comprise copper.

19. The semiconductor package of claim 14, furthering comprising one or more die coupled to the first side of the substrate.

20. The semiconductor package of claim 14, wherein the flange extends outwardly away from the hole in the substrate.

* * * * *